United States Patent [19]
Kirby et al.

[11] Patent Number: 5,431,332
[45] Date of Patent: Jul. 11, 1995

[54] METHOD AND APPARATUS FOR SOLDER SPHERE PLACEMENT USING AN AIR KNIFE

[75] Inventors: Thomas P. Kirby; Jonathon G. Greenwood, both of Lake Worth; Edward Juchniewicz, Delray Beach; Ovidiu Neiconi, Boynton Beach, all of Fla.

[73] Assignee: Motorola, Inc., Schaumburg, Ill.

[21] Appl. No.: 192,880

[22] Filed: Feb. 7, 1994

[51] Int. Cl.$^6$ .................... B23K 1/00; B23K 3/08; H05K 3/34
[52] U.S. Cl. .................... 228/246; 228/254; 118/213; 427/282
[58] Field of Search ........... 228/245, 246, 254, 180.22, 228/56.3; 118/213, 406; 427/123, 282, 287, 310; 437/183

[56] References Cited

U.S. PATENT DOCUMENTS

| | | | |
|---|---|---|---|
| 4,462,534 | 7/1984 | Bitaillou et al. | 228/246 |
| 4,830,264 | 5/1989 | Bitallou et al. | 228/245 |
| 4,871,110 | 10/1989 | Fukasawa et al. | 228/245 |
| 4,940,181 | 7/1990 | Juskey, Jr. et al. | 228/180.22 |
| 5,024,372 | 6/1991 | Altman et al. | 228/248.1 |
| 5,159,171 | 10/1992 | Cook et al. | 219/121.63 |
| 5,205,896 | 4/1993 | Brown et al. | 228/246 |
| 5,255,839 | 10/1993 | da Costa Alves et al. | 228/246 |

Primary Examiner—Samuel M. Heinrich
Attorney, Agent, or Firm—Pablo Meles

[57] ABSTRACT

A station (10) in a manufacturing line (12) for the accurate placement of solder balls (30) on a ball grid array package and for the removal of excess solder balls comprises a substrate (4) having an array of solder pads (7), and an adhesion layer (8) on the solder pads. The station further comprises a stencil (16) placed on top of the substrate and having a height between ¼ times the diameter of one of the solder balls and 5/4 times the diameter of one of the balls, the stencil having an array of apertures (18) corresponding to the array of solder pads and substantially exposing each of the solder pads of the array, a pallet (2) for holding and transporting the substrate to the stencil and further along the manufacturing line, a dispenser (26) for pouring solder balls in bulk over the stencil, a vibration device (20) coupled to the station for urging the solder balls into the apertures of the stencil and onto the adhesion layer above the solder pads, and a moving directed column of air (24) across the surface of the stencil to remove excess solder balls from the stencil.

23 Claims, 3 Drawing Sheets

METHOD AND APPARATUS FOR SOLDER SPHERE PLACEMENT USING AN AIR KNIFE

TECHNICAL FIELD

This invention relates generally to solder spheres, and in particular, to a method and apparatus of attaching and removing solder spheres from a substrate assembly.

BACKGROUND

The need for high density I/O chip carriers drives the electronics manufacturing industry to use ball grid array packages (BGA's) which have a high I/O count at a relatively course pitch. Bumping these carriers involves attachment of hundreds, and often thousands of solder spheres per array. Previously this process was built around a costly, high accuracy robot arm equipped with a precision tooled vacuum head to pick, flux, and place the tiny spheres. This process typically further included a vision equipped high accuracy robot arm (typically a Seiko XM) with a precision tooled vacuum head to handle the spheres. The result of this approach has been the development of an effective but expensive all in one robot station which handles the fluxing duties as well as the placement of the balls.

In this existing system, a pallet or bare board enters a station and is located. Fiducials are identified and a robotic arm having a vacuum head picks all spheres at once from a bulk bin holding thousands of solder spheres. After absence/presence inspection, the robot arm proceeds to a fluxing plate and touches the spheres to the flux surface, inspects for lost balls, then places the entire grid of solder balls on an array of solder pads on a substrate. A post inspection of the vacuum head guards against stuck solder spheres. The advantage of this station is that it is an all in one operation. Also the vision inspection can avoid or trap obvious defects. Again, the major drawback is the cost for a typical station. Thus, as the requirement for higher density I/O chip carriers increases, so does the cost of the existing process using a higher accuracy robotic arm.

Additionally, there are a number of other significant problems which present themselves in a pick, flux, and place bumping application. Simply picking the spheres out of the bin with the vacuum head is tough to do since the supply level is constantly changing. Spheres are occasionally lost in the flux while dunking. Also, flux touching the vacuum head can easily get sucked up into a hole, clogging the port, or making solder spheres stick to the end effecter (of the vacuum head) after placement. Therefore, there exists a need for a cost effective method and apparatus that could eliminate the detriments of the existing process described above.

SUMMARY OF THE INVENTION

A method of solder bumping an array of solder pads on a substrate, comprises the steps of applying an adhesion layer to the solder pads in the array of solder pads, placing a stencil over the substrate, the stencil having an array of apertures corresponding to the array of solder pads, each aperture exposing a substantial portion of each of the solder pads in the array. Then solder balls are applied in bulk onto the stencil, wherein the stencil allows only one solder ball per aperture. Finally, the excess solder balls are removed from the stencil.

In another aspect of the present invention, a station for the placement of solder balls on a ball grid array package and for the removal of excess solder balls, comprises a substrate having an array of solder pads, an adhesion layer on the solder pads, a stencil placed on top of the substrate, the stencil having an array of apertures corresponding to the array of solder pads and substantially exposing each of the solder pads of the array, a pallet for holding and transporting the substrate to the stencil and further along a manufacturing line. The station further comprises a dispenser for pouring solder balls in bulk over the stencil, a vibration device coupled to the station for urging the solder balls into the apertures of the stencil and onto the adhesion layer above the solder pads and a moving directed column of air across the surface of the stencil to remove excess solder balls from the stencil.

DETAILED DESCRIPTION OF THE PREFERRED EMBODIMENT

Figure 1:
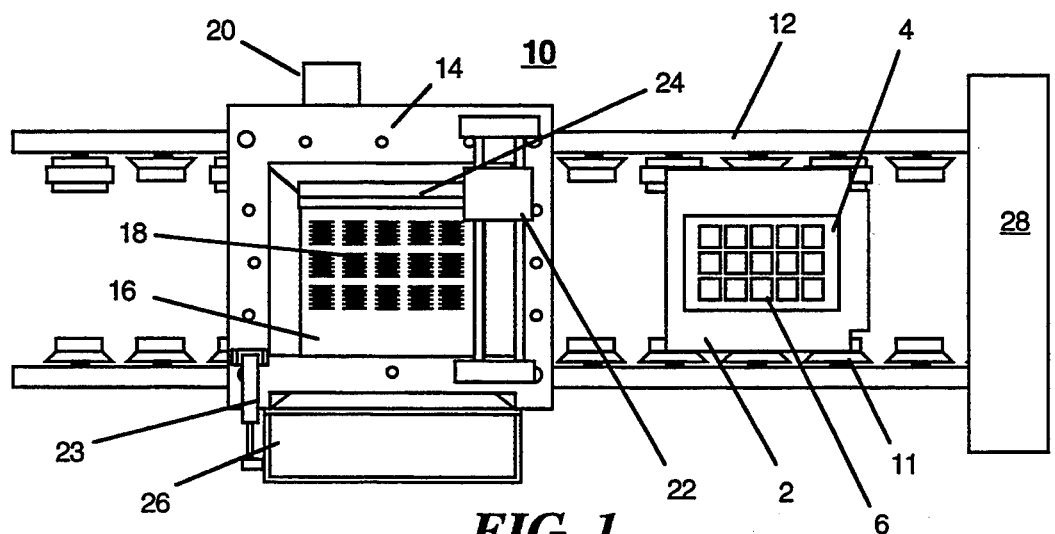
FIG. 1 is top view of a manufacturing line having a station in accordance with the present invention.
Figure 2:
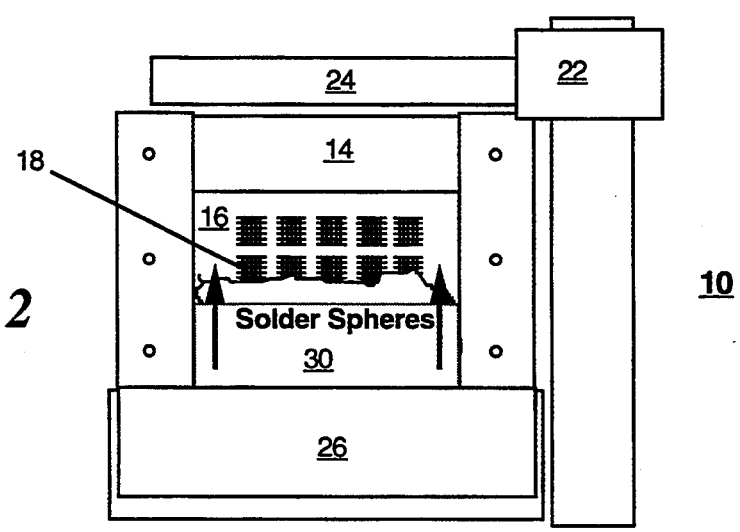
FIG. 2 is a top view of the station of FIG. 1 illustrating the bulk pouring of solder spheres onto a stencil in accordance with the present invention.

Referring to FIG. 1, there is shown a station 10 in a manufacturing line 12 for the accurate placement of solder balls or spheres on a ball grid array (BGA) carrier or package and for the removal of excess solder balls from the top surface of a stencil 16 once the solder spheres are set in place. The station 10 preferably comprises a frame 14 having the stencil 16. The stencil preferably has an array of apertures 18 that have diameters for allowing entry of one solder sphere per aperture. For example, stencil apertures having a diameter of 0.023" would be ideally suited for 0.020" diameter solder balls. The station 10 further comprises a bulk dispenser/bin 26 of solder spheres which also serves as a reservoir for the excess solder spheres when they are removed from the stencil as will be shown. As shown, a pneumatic or alternatively a hydraulic lift 23 can be used to lift the bin to dispense the solder spheres from the dispenser 26 and subsequently return the dispenser to its original position as a bin. Preferably, the station further comprises a means for urging the solder spheres into the apertures of the stencil such as a vibrating device 20. The vibrating device is preferably a low amplitude, low frequency vibrator. A pneumatic slide 22 allows a directed column of air 24 (such as an Air Knife by EXAIR Corporation) to move across the surface of the stencil to remove excess solder balls as will be shown.

The station 10 preferably uses a pallet 2 to hold and transport (on rollers 11) a substrate 4 having solder pads that are previously fluxed to the frame 14. The fluxed substrate and pallet are located and aligned with the matching BGA pattern of the stencil above. Once the solder spheres are placed on the substrate and the excess solder spheres removed from the stencil, the pallet transpods the BGA solder bumped substrate 6 on rollers 11 towards a next station such as a reflow oven 28.

Figure 3:
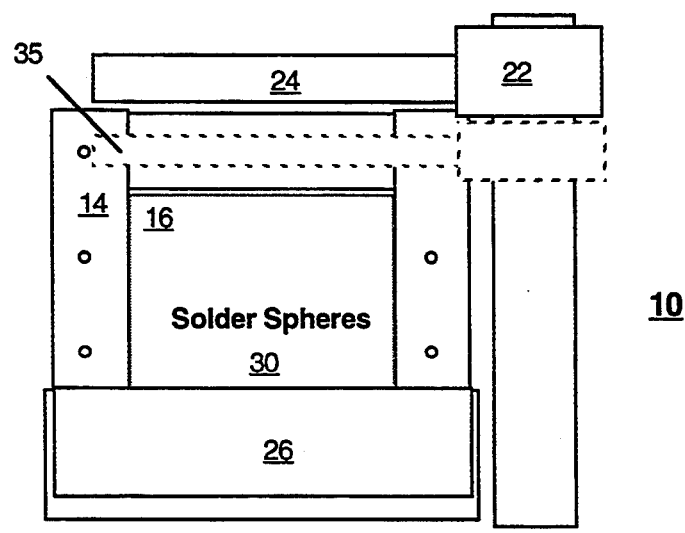
FIG. 3 is a top view of the station of FIG. 1 illustrating solder spheres covering the stencil in accordance with the present invention.
Figure 4:
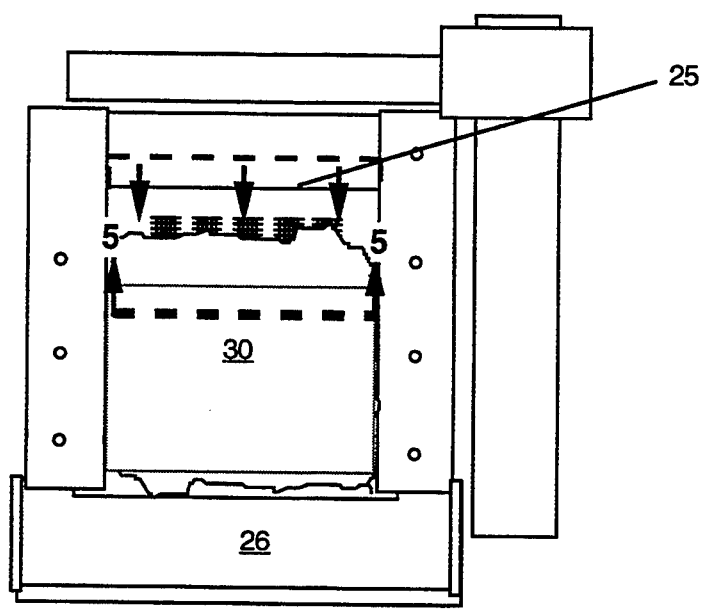
FIG. 4 is a top view of the station of FIG. 1 illustrating the start of the removal of the excess solder spheres off the stencil in accordance with the present invention.
Figure 5:
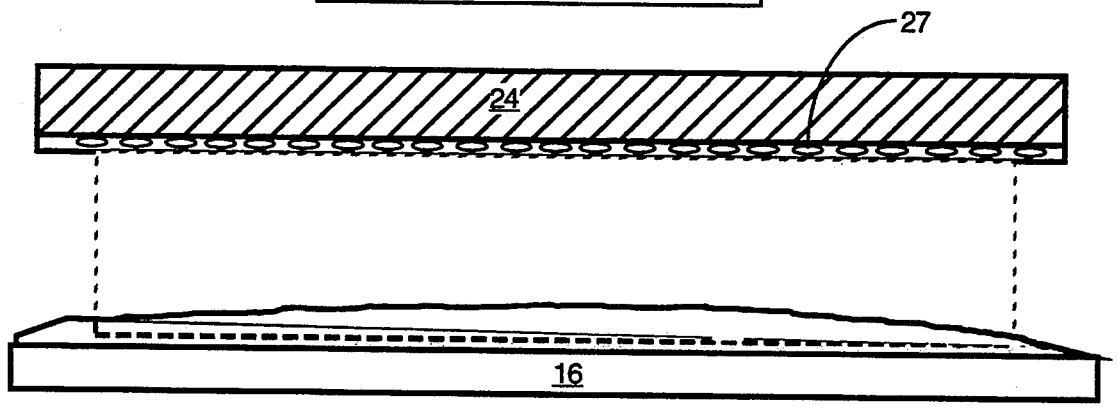
FIG. 5 is a side cut-view of the station of FIG. 1 along line 5—5 of FIG. 4 showing a directed column of air used for plowing the excess solder balls off the stencil in accordance with the present invention.

With regard to FIGS. 2-8, the process of placing solder spheres onto a BGA substrate or carrier and the removal of excess balls from a stencil will be described in further detail. Once the pallet 4 (see FIG. 1) is lifted and located or aligned below the stencil, the bin/dispenser 26 in FIG. 2, bulk pours solder spheres 30 onto the stencil 16 having the array of apertures 18. The vibrator 20 is turned for several seconds to urge the solder spheres into the array of apertures 18. The pneumatic slide 22 and directed air column 24 remain retracted at this point. FIG. 3 illustrates how the solder spheres cover all the apertures or openings of the stencil after the vibration is provided. Further note how the frame 14 serves to corral the solder spheres within the confines of the top surface area of the stencil 16. At this point, the vibrator 20 is turned off and optionally, a brush 35 makes an initial sweeping of the solder spheres towards the bin 26 as shown in FIG. 3. Optionally, referring to FIG. 4, a directed column of air built into the back wall of the frame serves to initially sweep the excess solder balls 30 towards the reservoir 26. Next, in FIG. 6, the pneumatic slide 22 moves the directed column of air 24 in the direction shown, literally air brushing or plowing the excess solder balls 30 off the surface of the stencil 16 towards the reservoir 26. FIG. 5 shows a side cut-view of the station of FIG. 1 along line 5—5 of FIG. 4 showing the directed column of air used for plowing the excess solder balls off the stencil in accordance with the present invention. As shown, the directed column of air can be a series of through holes 27 or alternatively a single sleeved-shaped gap as used in the commercially available Air Knife by EXAIR Corporation.

Figure 6:
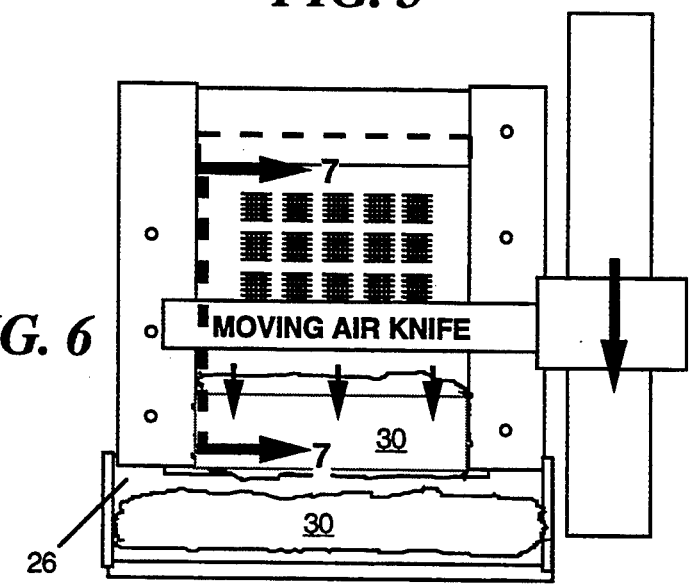
FIG. 6 is a top view of the station of FIG. 1 illustrating another step in the removal of the solder spheres of the stencil in accordance with the present invention.
Figure 7:
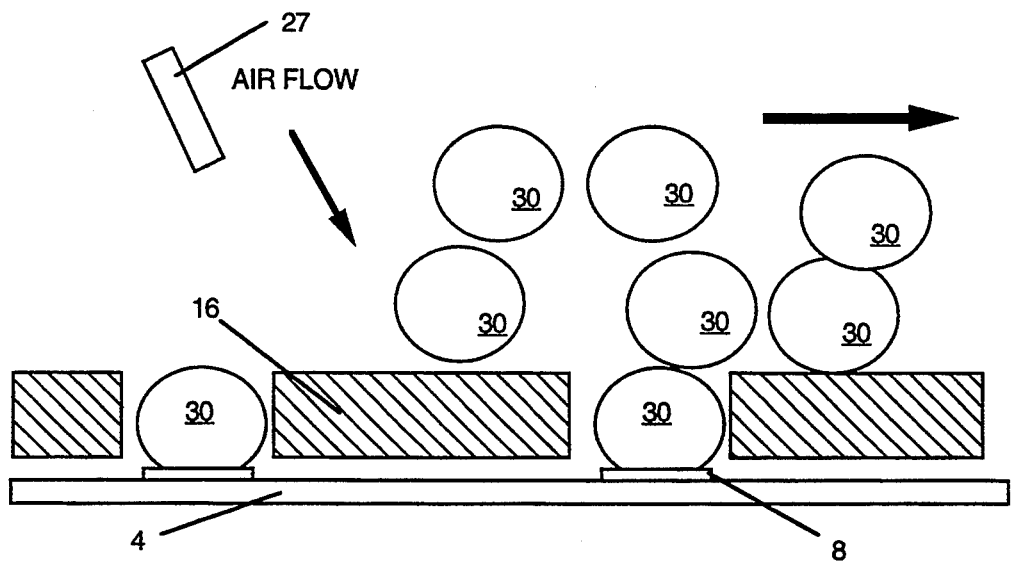
FIG. 7 is a side cut-view of the station of FIG. 1 along line 7—7 of FIG. 6 showing the removal of excess solder spheres and the placement of solder spheres within the apertures of the stencil in accordance with the present invention.

Referring to FIG. 7, a side cut-view of the station of FIG. 1 along line 7—7 of FIG. 6 shows the removal of excess solder spheres and the placement of solder spheres within the apertures of the stencil in accordance with the present invention. The directed column of air originating from the series of holes 27 (or alternatively from the sleeved shaped gap of an Air Knife) is mounted slightly above the stencil and directed down in an angular fashion as shown. Thus, the directed column of air 24 serves as a plow in removing the remaining layers of solder balls and leaving the located spheres within their respective stencil apertures. Then, ideally, the stencil 16 is removed and the BGA solder bumped substrate 6 (See FIG. 1) is forwarded to the next station, preferably a reflow oven 28.

Figure 8:
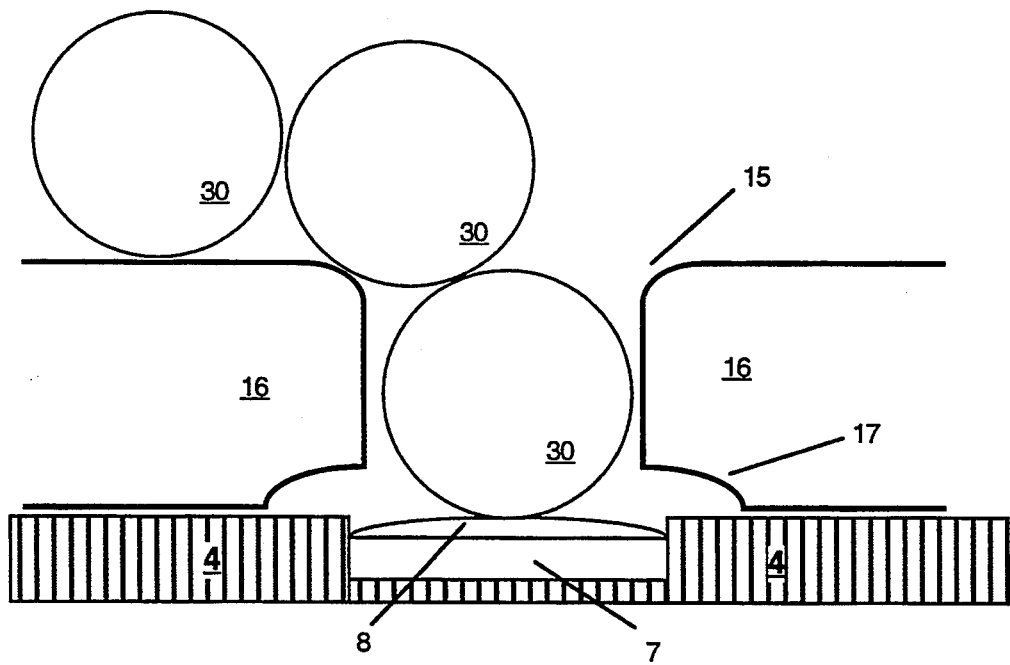
FIG. 8 is an enlarged side-cut view similar to FIG. 7 in accordance with the present invention.

Finally, referring to FIG. 8, a enlarged side-cut view is shown similar to FIG. 7. The top side of the stencil 16 has a beveled periphery 15 around the apertures to provide a rounded contact area between the excess balls and the top of the stencil aperture. This reduces the likelihood of extra balls sticking to the surface when the directed column of air or an Air Knife passes over. This beveled periphery 15 also makes it easier for the primary balls to locate themselves in the openings during vibration and onto the flux 8 above the solder pads 7. The bottom side of the stencil is "domed" (17) to provide extra clearance from the fluxed solder pad (7 and 8), since the solder spheres 30 have very little mass and will readily cling to any extra flux in the area. Nickel plating of the stencil can also provide a slicker surface which is desirable when trying to blow off the excess solder spheres.

This technique has been successful for today's BGA packages having 0.020"-0.030" solder balls and 0.040"-0.060" centers and should equally be applicable to future BGA packages having smaller solder balls and with arrays having smaller center spacings.

The present invention has been described in detail in connection with the disclosed embodiments. These embodiments, however, are merely examples and the invention is not restricted thereto. It will be understood by those skilled in the art that variations and modifications can be made within the scope and spirit of the present invention as defined by the appended claims.

What is claimed is:

1. A method of solder bumping an array of solder pads on a substrate, comprising the steps of:
    applying an adhesion layer to the solder pads in the array of solder pads;
    placing a stencil over the substrate, the stencil having an array of apertures corresponding to the array of solder pads, each aperture exposing a substantial portion of each of the solder pads in the array;
    applying solder balls in bulk onto the stencil, wherein the stencil allows only one solder ball per aperture; and
    removing excess solder balls by using gravity by tilting the stencil and substrate.

2. The method of claim 1, wherein the step of removing excess solder balls includes the step of brushing the excess balls off the stencil before tilting.

3. The method of claim 1, wherein the step of removing excess solder balls includes the step of blowing the excess balls off the stencil.

4. The method of claim 1, wherein the method further comprises the step of fixing the stencil and substrate on a pallet.

5. The method of claim 1, wherein the method further comprises the steps of removing the stencil and reflowing the solder balls onto the array of solder pads.

6. The method of claim 1, wherein the step of applying solder balls includes the step of using a vibrator to urge the placement of the solder balls into the aperture of the stencil and onto the adhesion layer.

7. The method of claim 1, wherein the adhesion layer comprises a tacky flux.

8. A method of solder bumping an array of solder pads on a substrate, comprising the steps of:
    applying an adhesion layer to the solder pads in the array of solder pads;
    placing a stencil over the substrate, the stencil having an array of apertures corresponding to the array of solder pads, each aperture exposing a substantial portion of each of the solder pads in the array;
    applying solder balls in bulk onto the stencil, wherein the stencil allows only one solder ball per aperture; and
    removing excess solder balls by using a directed column of air across the surface of the stencil.

9. The method of claim 8, wherein the step of removing excess solder balls further includes the step of brushing the excess balls off the stencil.

10. The method of claim 8, wherein the method further comprises the steps of registering the substrate onto a pallet and then registering the substrate and pallet to the stencil by matching the array of apertures of the stencil to the array of solder pads on the substrate.

11. The method of claim 8, wherein the method further comprises the steps of removing the stencil and reflowing the solder balls onto the array of solder pads.

12. The method of claim 8, wherein the adhesion layer comprises a tacky flux.

13. The method of claim 8, wherein the step of applying solder balls includes the step of using a vibrator to urge the placement of the solder balls into the aperture of the stencil and onto the adhesion layer.

14. A station in a manufacturing line for the accurate placement of solder balls on a ball grid array package and for the removal of excess solder balls, comprising:
a substrate having an array of solder pads;
an adhesion layer on the solder pads;
a stencil placed on top of the substrate which allows only one solder ball to contact each solder pad, the stencil having an array of apertures corresponding to the array of solder pads and substantially exposing each of the solder pads of the array;
a pallet for holding and transporting the substrate to the stencil and further along the manufacturing line;
a dispenser for pouring solder balls in bulk over the stencil;
a vibration device coupled to the station for urging the solder balls into the apertures of the stencil and onto the adhesion layer above the solder pads; and
a means for removing excess solder balls from the stencil.

15. The station of claim 14, wherein the adhesion layer on the solder pads comprises a tacky flux.

16. The station of claim 14, wherein the dispenser for pouring solder balls also serves as a reservoir where the excess solder balls are retained.

17. The station of claim 14, wherein the means for removing comprises a moving directed column of air across the surface of the substrate.

18. The station of claim 14, wherein the means for removing comprises a device for tilting the stencil and substrate to allow the solder balls to roll off with gravity.

19. A station for the in a manufacturing line for the accurate placement of solder balls on a ball grid array package and for the removal of excess solder balls, comprising:
a substrate having an array of solder pads;
an adhesion layer on the solder pads;
a stencil placed on top of the substrate and having a height between $\frac{1}{4}$ times the diameter of one of the solder balls and 5/4 times the diameter of one of the balls, the stencil having an array of apertures corresponding to the array of solder pads and substantially exposing each of the solder pads of the array;
a pallet for holding and transporting the substrate to the stencil and further along the manufacturing line;
a dispenser for pouring solder balls in bulk over the stencil;
a vibration device coupled to the station for urging the solder balls into the apertures of the stencil and onto the adhesion layer above the solder pads; and
a moving directed column of air across the surface of the substrate to remove excess solder balls from the stencil.

20. The station of claim 19, wherein the stencil comprises a thin metallic surface having a height substantially the diameter of the solder balls.

21. The station of claim 19, wherein the stencil comprises a nickel plated surface.

22. The station of claim 19, wherein the dispenser for pour solder balls also serves as a reservoir where the excess solders balls are retained.

23. The station of claim 19, wherein the moving directed column of air comprises an air knife.

* * * * *